US006898756B1

(12) United States Patent
Fekri et al.

(10) Patent No.: US 6,898,756 B1
(45) Date of Patent: May 24, 2005

(54) SYSTEM AND METHOD FOR ENABLING EFFICIENT ERROR CORRECTION AND ENCRYPTION USING WAVELET TRANSFORMS OVER FINITE FIELDS

(75) Inventors: Faramarz Fekri, Atlanta, GA (US); Steven W. McLaughlin, Decatur, GA (US); Russell M. Mersereau, Atlanta, GA (US); Ronald W. Schafer, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/268,555

(22) Filed: Mar. 15, 1999

(51) Int. Cl.$^7$ .............................................. H03M 13/03
(52) U.S. Cl. ...................................... 714/786; 714/746
(58) Field of Search ............................... 714/752, 746, 714/761, 762, 786; 702/190; 704/267; 382/240

(56) References Cited

U.S. PATENT DOCUMENTS

| | | | | |
|---|---|---|---|---|
| 5,271,016 A | * | 12/1993 | Hilden et al. ............... | 714/752 |
| 5,802,481 A | * | 9/1998 | Preto .......................... | 702/190 |
| 5,826,232 A | * | 10/1998 | Gulli .......................... | 704/267 |
| 6,236,758 B1 | * | 5/2001 | Sodagar et al. ............. | 382/240 |

OTHER PUBLICATIONS

Sarkar et al., "Finite Field Wavelet Transforms and Multi-level Error Protection", Information Theory, 1995 IE International Symposium, pp. 428.*

Klappenecker et al., "Galois Theory and Wavelet Transforms", Information Theory, 1995 IE International Symposium, pp. 429.*

Averkamp et al., "Some Distributional Properties of the Continuous Wavelet Transform of Random Processes", IEEE Transactions on Information Theory, vol. 44, No. 3, May 1998, pp. 1111–1128.*

Giuseppe Caire, Robert L. Grossman, and H. Vincent Poor, "Wavelet Transforms Associated with Finite Cyclic Groups," *IEEE Transactions On Information Theory*, vol. 39, No. 4, Jul. 1993, pp. 1157–1166.

Oliver Rioul, "A Discrete–Time Multiresolution Theory," *IEEE Transactions on Signal Processing*, vol. 41, No. 8, Aug. 1993, pp. 2591–2606.

Todor Cooklev, Akinori Nishihara, Mike Sablatash, "Theory of Filter Banks over Finite Fields," *IEEE*, Proc. Asia Pacific Conf. Circuits Syst., Taipei, Taiwan, Dec. 1994, pp. 260–265.

(Continued)

*Primary Examiner*—David Ton
(74) *Attorney, Agent, or Firm*—Thomas, Kayden, Horstemeyer & Risley, LLP (57) ABSTRACT

A system and method for enabling efficient error correction and encryption using wavelet transforms over finite fields. The system and method utilizes the combination of a channel encoder and channel decoder to correct errors to source data after transmission over a physical channel or storage in a storage medium. The channel encoder mathematically generates a set of wavelet coefficients by performing a combination of filtering and/or processing of a received message vector. The wavelet coefficients are then utilized by the channel encoder to cause its filters to transform message data into transmission data. The channel decoder receives the transmitted source data in the form of a code word/channel error combination and performs filtering to render a syndrome, representative of the channel error. Analysis of the syndrome is performed to determine the actual error, which is utilized to derive the actual source data.

100 Claims, 9 Drawing Sheets

OTHER PUBLICATIONS

Mitchell D. Swanson and Ahmed H. Tewfik, "A Binary Wavelet Decomposition of Binary Images," *IEEE Transactions on Image Processing,* vol. 5, No. 12, Dec. 1996, pp. 1637–1650.

See–May Phoong and P. P. Vaidyanathan, "Paraunitary Filter Banks Over Finite Fields," *IEEE Transactions on Signal Processing,* vol. 45, No. 6, Jun. 1997, pp. 1443–1457.

Faramarz Fekri, "Transform Representation of Finite Field Signals," Center for Signal and Image Processing, School of Electrical and Computer Engineering, Georgia Institute of Technology, Atlanta, GA, 30332, May 1998, pp. 1–31.

F. Fekri, R. M. Mersereau, R. W. Schafer, "Data Encryption Using Finite Field Wavelet Transforms," Center for Signal & Image Processing, Georgia Institute of Technology, Atlanta, GA, 30332, Nov. 13, 1998, pp. 1–10.

F. Fekri, S. W. McLaughlin, R. M. Mersereau, and R. W. Schafer, "Double Circulant Self–Dual Codes Using Finite–Field Wavelet Transforms," Applied Algebra, Algebraic Algorithms and Error Correcting Codes Conference, Oct., 1999, pp. 1–9. http://www.ee.gatech.edu/users/fekri/.

F. Fekri, S. W. McLaughlin, R. M. Mersereau, and R. W. Schafer, "Error Control Coding Using Finite–Field Wavelet Transforms," Center for Signal & Image Processing, Georgia Institute of Technology, Atlanta, GA, 30332, Feb., 1999, pp. 1–13. http://www.ee.gatech.edu/users/fekri/.

F. Fekri, R. M. Mersereau, R. W. Schafer, "Theory of Wavelet Transform Over Finite Fields," Int. Conf. On Acoustics, Speech and Signal Proc., Mar. 16, 1999, pp. 1–4.

H. Vincent Poor, "Finite–Field Wavelet Transforms," Department of Electrical Engineering, Princeton University, Princeton, NJ, 08544, USA, 1996, pp. 225–238.

Sandip Sarkar and H. Vincent Poor, "Certain Generalizations of the Cyclic Wavelet Transform," Twenty–Ninth Annual Conference of Information Sciences and Systems, Baltimore, MD, USA, Mar., 1995, pp. 249–254.

See–May Phoong and P. P. Vaidyanathan, "New Results on Paraunitary Filter Banks Over Finite Fields," *IEEE,* Int. Symposium on Circuits and Systems, 1996, pp. 413–416.

Sandip Sarkar and H. Vincent Poor, "Multiband Cyclic Wavelet Transforms," Department of Electrical Engineering, Princeton University, Princeton, NJ, 08544, pp. 1–4.

Faramarz Fekri, Russell M. Mersereau, Ronald W. Schafer, "Finite Field Wavelet Transforms, A Proposal for Error Control Coding—Part I: Discrete–Time Wavelet Basis Functions Over Finite Fields," Center for Signal & Image Processing, Georgia Institute of Technology, Atlanta, GA, 30332–0250, pp. 1–20.

\* cited by examiner

SYSTEM AND METHOD FOR ENABLING EFFICIENT ERROR CORRECTION AND ENCRYPTION USING WAVELET TRANSFORMS OVER FINITE FIELDS

FIELD OF THE INVENTION

The present invention generally relates to signal processing, and more particularly, to providing encryption and error correction of data using wavelet transformation over a finite field.

BACKGROUND OF THE INVENTION

The advancement of technology has led to an increasing demand for efficient and reliable data transmission and storage systems. This demand has led to the creation of new methods of data encryption for data storage and data transmission over physical channels. In addition, a major concern of the designers of such systems has been the controlling of errors so that reliable reproduction of data can be obtained.

Filter banks and wavelet transforms have established themselves as powerful tools in the analysis of signals and images when these objects are viewed as sequences over real or complex fields. The extension of the wavelet transform to the situation in which the complex field is replaced with a finite field is of particular interest since wavelets and filter banks over finite fields have potential application in cryptography and the theory of error correction codes.

SUMMARY OF THE INVENTION

Briefly described, the invention provides a system and method for creating and using finite-field wavelet transforms, and their application on encryption and error correcting codes, thereby providing for the effective and efficient combination of data encryption and channel coding in a single stage.

Generally, the first embodiment of the system of the invention utilizes the combination of a source encoder, an encryption device, a channel encoder, and a modulator to prepare source data, inputted from an information source, to be transmitted to a receiver over a physical channel or stored in a storage medium. After transmission the data may contain errors therein. Therefore, after passing the encoded and encrypted data through the physical channel, a demodulator, channel decoder, decryption device and source decoder are utilized to derive the originally sent data without errors.

According to the invention, the above-mentioned channel encoder, which is in the form of one or more filters, generates a set of wavelet coefficients. In the first embodiment of the invention these coefficients are the product of a filtered received message. The wavelet coefficients are then utilized by the channel encoder to cause the filters to transform message data into transmission data. The above-mentioned coefficients are derived by utilizing a series of mathematical relational equations.

The channel encoder implements the use of redundancy in order to enhance accurate error correction by the decoder. By increasing an inputted message vector's length, an outputted code word, which is transmitted through the physical channel or to the storage medium, contains redundant bits. Thereafter, an analysis of the transmitted redundant code word is utilized to obtain the true message.

The above-mentioned channel decoder receives the transmitted code word which may contain errors therein. Similar to the channel encoder, one or more filters structure the channel decoder and perform filtering of the transmitted code word. Filtering of the code word/channel error combination renders a syndrome which is representative of the channel error. The syndrome is then analyzed by a conditional interpolator which derives the actual error. Subtraction of the error from the received code word/channel error combination derives the code word sent by the channel encoder, before imputation of error. Finally, a wavelet transformation of the code word renders the actual message.

The invention has numerous advantages a few of which are delineated hereafter as examples. Note that the embodiments of the invention described herein posses one or more, but not necessarily all, of the advantages set out hereafter.

One advantage of the invention is that it avoids the limitations inherent in the number theoretic Fourier transform over finite fields by relying on a basis decomposition in the time domain rather than in the frequency domain.

Another advantage of the present invention is that it provides a quick and efficient way of alleviating transmission errors received from the transmission of a code word imputed through a physical channel.

Another advantage of the present invention is how the finite field wavelet transform can be used to encode and decode some of the important family of the codes in a simple and computationally efficient way.

Another advantage of the present invention is that the invention is an efficient way of performing data encryption, or channel coding, or a combination thereof, in a single stage using finite field wavelet transforms, thereby enhancing the security of the transmission system and providing error correcting code for accurate reception by the receiver.

Another advantage of the present invention is that it contains the dual benefit of being extremely fast and requiring very little hardware in comparison to other existing techniques.

Other objects, features and advantages of the present invention will become apparent to one of reasonable skill in the art upon examination of the following drawings and detailed description. It is intended that all such additional objects, features and advantages be included herein within the scope of the present invention, as defined by the claims.

DESCRIPTION OF THE DRAWINGS

The present invention will be more fully understood from the detailed description given below and from the accompanying drawings of the preferred embodiments of the invention, which however should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION

The performance of mathematical operations and supplying of filter coefficients for the encoder and decoder filters of the present invention may be accomplished by utilizing hardware, software, firmware, or a combination thereof. Further detailed disclosure of these provisions is provided herein.

Figure 1:
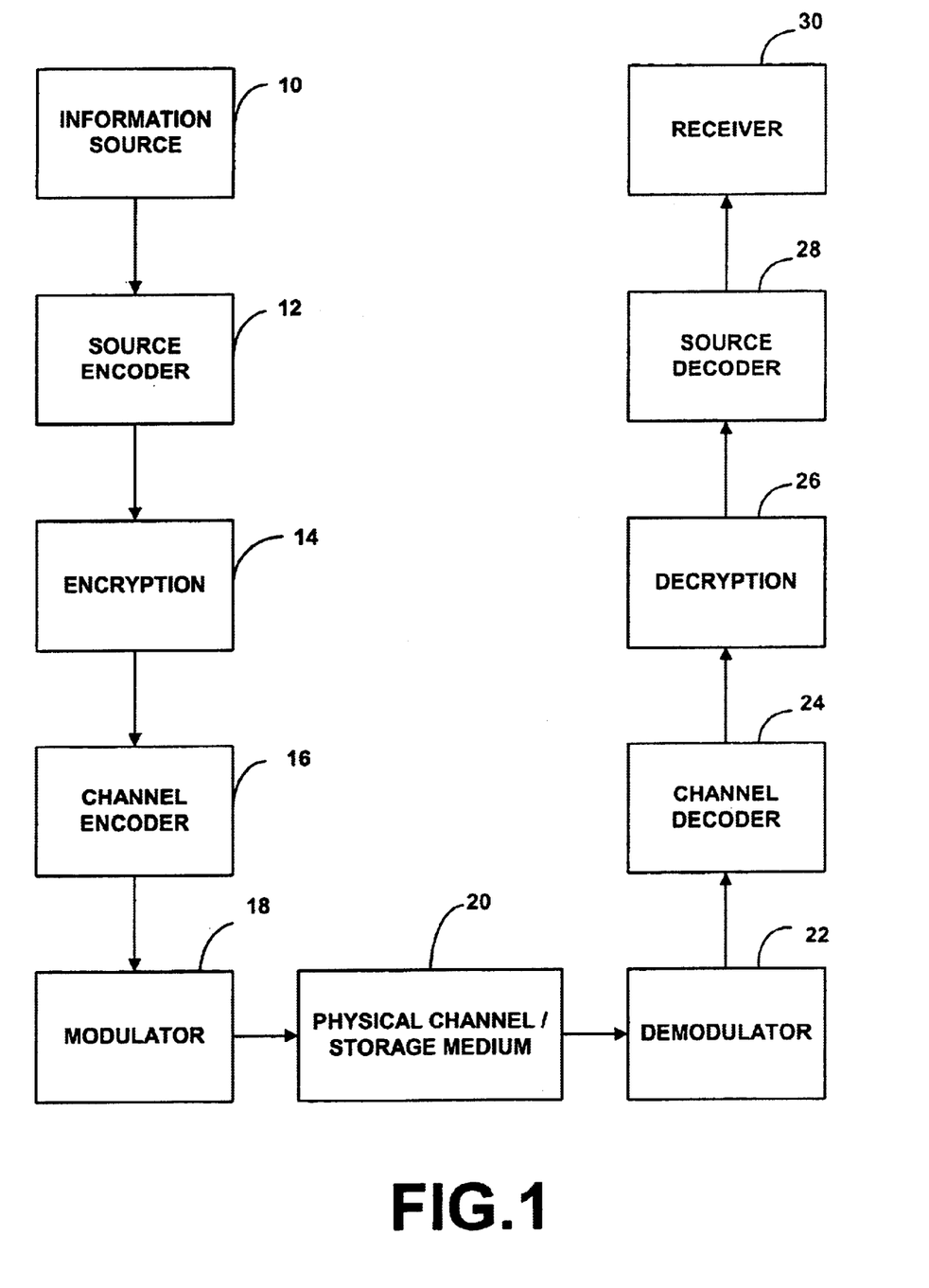
FIG. 1 shows a flow diagram depicting a transmission (or storage) system employing error control coding and encryption.

Turning now to the drawings, wherein like reference numerals designate corresponding parts throughout the drawings, FIG. 1 illustrates a typical transmission (or storage) system employing error control coding and encryption. As is depicted, an information source 10, which may be a person, or a machine such as a computer, outputs source data, which is to be communicated to a receiver 30, to a source encoder 12. The source output may be either a continuous waveform or a sequence of discrete symbols. The source encoder 12 transforms the source output into a sequence of binary digits referred to as an information sequence, as is known to one of reasonable skill in the art.

Optionally, the source data may then be encrypted by an encryption device 14 to enhance security while transmitting to receiver 30. The encrypted data, referred to hereinafter as a message vector (or stream), is then transmitted to a channel encoder 16 which transforms the message vector into a discrete encoded sequence referred to as a code word. The design and implementation of the channel encoder 16 is discussed in further detail herein.

Since discrete symbols are not suitable for transmission over a physical channel 20 or recording on a digital storage medium 20, the code word is transmitted to a modulator 18 which transforms each output symbol of the channel encoder 16 into a waveform which is suitable for transmission over the physical channel (or recording) 20.

When the waveform enters the physical channel (or storage medium) 20, it may become corrupted, and therefore contain errors. As examples, typical physical channels 20 include, but are not limited to, telephone lines, microwave links, satellite links, and high-frequency radio links. Also, typical storage media 20 include, but are not limited to, semiconductor memories, core memories, magnetic tapes, disk files, and optical memory units. The transmitted waveform is then processed by a demodulator 22 which is capable of producing a discrete or continuous output. The sequence outputted by the demodulator 22 corresponds to the code word, however the sequence may contain errors introduced by the physical channel (or storage medium) 20.

The sequence outputted by the demodulator 22 is then transmitted to a channel decoder 24 which estimates the original message vector from the received sequence. Particular error correction with reference to the invention is provided for by the channel decoder 24 which shall be discussed in further detail herein. If the source data was encrypted, the estimation of the original message vector is then transmitted to a decryption device 26. After decryption, the estimation of the original message vector is transmitted to the source decoder 28 which transforms the estimated sequence into an estimate of the source output and delivers this estimate to the receiver 30.

In accordance with the first embodiment of the invention the channel encoder 16 receives the message vector from the encryption device 14 in order to create a code word, which is latter transmitted to the modulator 18. As a preliminary matter, throughout the embodiments of the invention all arithmetic is carried out in a specific finite field, GF(p'), where GF denotes a Galois field, p is a prime number and r relates to the type of finite field represented. As an example, if the desired field of use is the binary field, the specific finite field will be GF(2).

The following description of the embodiments of the invention concerning the channel encoder 16 and channel decoder 24 are described with reference to block code, of which half-rate code is a specific type. While block code is utilized, it should be noted that convolution code may also be provided for by this invention.

Figure 2:
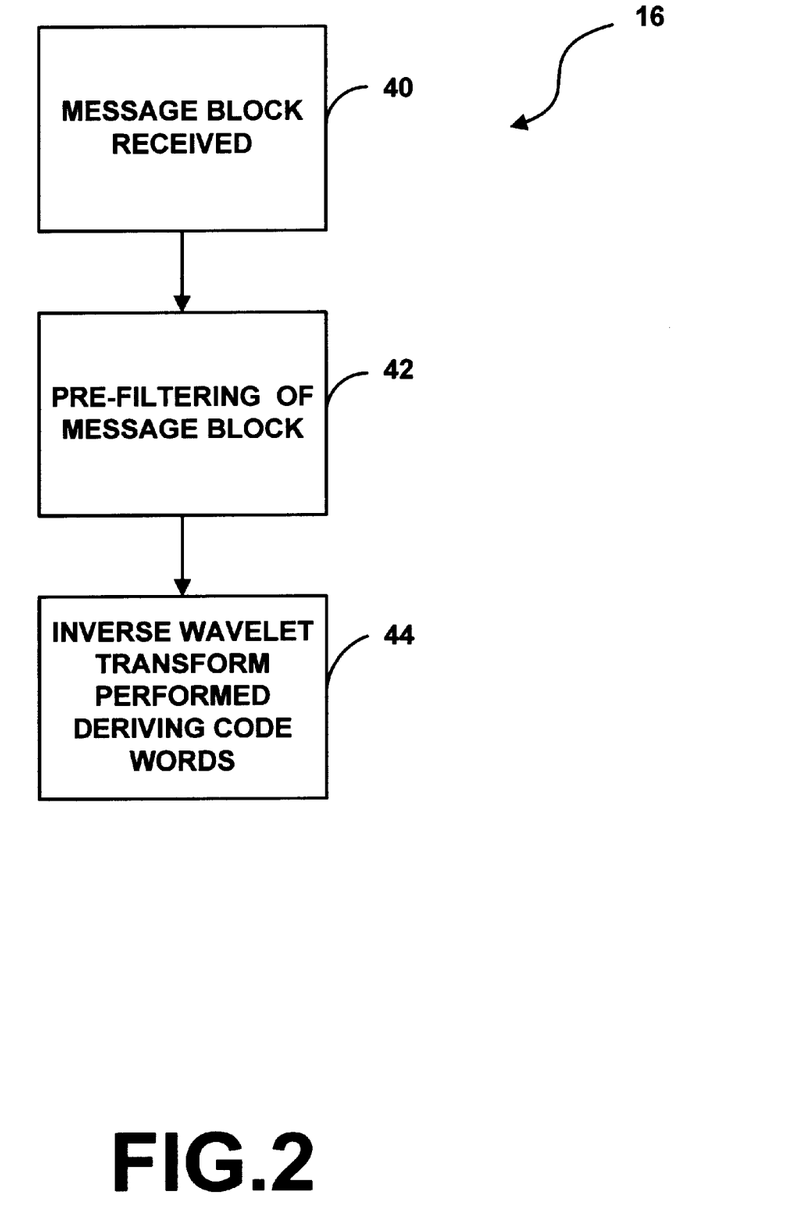
FIG. 2 is a functional representation of the channel encoder of FIG. 1 after receiving a message block from the encryption device.

In accordance with FIG. 2, half-rate code is utilized for an accurate description of the encoder and decoder of the first embodiment of the invention. It should be noted that other types of block code are provided for as well. Specifically, arbitrary rate code is also discussed herein, with reference to the second embodiment of the invention, in FIG. 7. As is understood by one of reasonable skill in the art, a characteristic of half-rate code is that the code word is double the size of the message vector length. Also, it is understood that, in accordance with the utilization of block code, the message vector is the same as the defined message block length.

Channel Encoder

FIG. 2 is a functional representation of the channel encoder 16 after receiving a message block from the encryption device 14 of FIG. 1. In accordance with the first embodiment of the invention, the message block is first received by the channel encoder 16 from the encryption device 14 (step 40). This message block is then pre-filtered to derive wavelet coefficients corresponding to a desired code (step 42). An inverse wavelet transform is then performed on the message block to derive the code words for transmitting to the receiver 30 (step 44).

Figure 3:
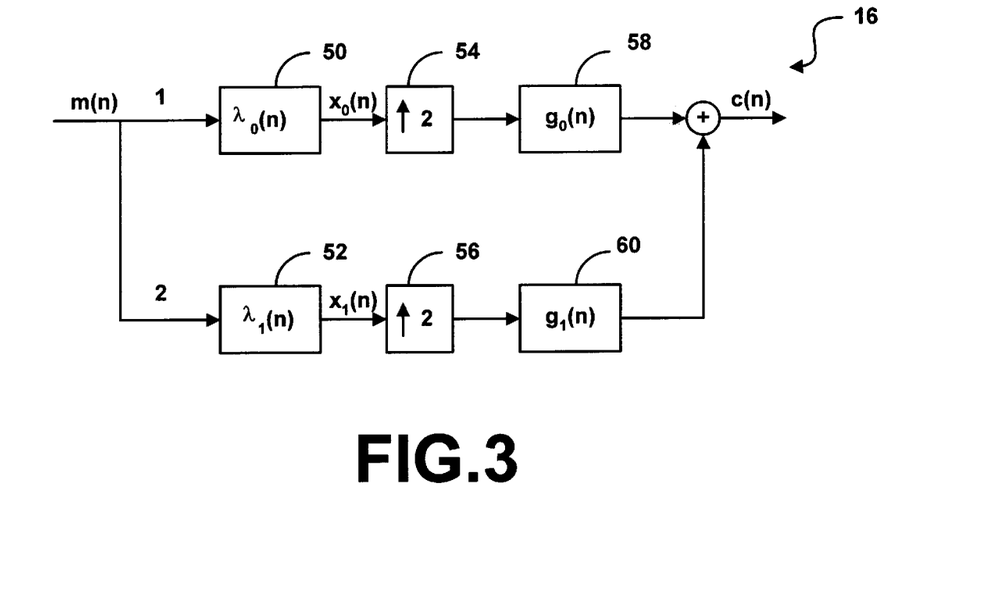
FIG. 3 shows a block diagram of the filter bank structure forming the channel encoder of FIG. 1, utilizing half-rate code.

As shown in FIG. 3 the channel encoder 16 comprises a filter bank structure which utilizes half-rate codes. First, the message block is sent to two parallel branches of the encoder structure, namely branches 1 and 2. It should be noted that, although in half-rate code the vector message is divided into two identical representations, if other varieties of code were utilized, the message block would be represented accordingly. The message is then pre-filtered by filter $\lambda_0(n)$ 50 on the first branch and $\lambda_1(n)$ 52 on the second branch, providing wavelet coefficients $x_0(n)$ and $x_1(n)$ respectively. An inverse wavelet transform is then performed on both the first and second branches wherein, the wavelet coefficients are first up-sampled by a factor of 2 by operation blocks 54 and 56, and then filtered through filters $g_0(n)$ 58 and $g_1(n)$ 60 respectively. As is well known in the art, up-sampling involves inserting a zero bit between each sample of the message code. Finally, after an inverse wavelet transform is performed, the first and second branches are added together thereby deriving the code word. This combination of pre-filtering, up-sampling and performing an inverse wavelet transform is well known in the art to be a specific example of a frame operation.

The channel encoder 16 may implement the use of redundancy with reference to the code word transmitted to the receiver 30, thereby inhibiting the effect of errors upon the transmitted code word. As an example, when using block codes, if an inputted message block has a length of 10, a code word of length greater than 10, e.g., 20 or 30, may be created. Since the redundant code word is the information which is transmitted through the physical channel 20, or stored in the storage medium 20, the vital information is protected within the code word due to this redundancy. The common values among the transmitted redundant code word are then utilized as the true message.

Figure 4:
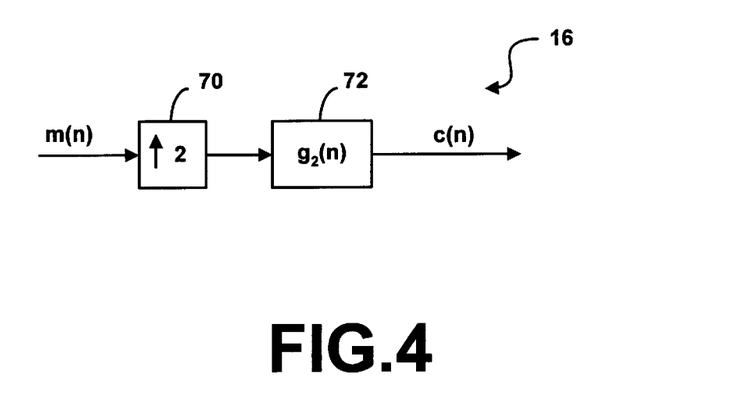
FIG. 4 shows an alternate embodiment of the channel encoder of FIG. 3.

While the aforementioned description of FIG. 3 describes the filter bank structure in detail, FIG. 3 may also be represented by FIG. 4, which is a more efficient implementation of the first embodiment of the invention. In relation to FIG. 4 the message block is first up-sampled by a factor of two by operation block 70. After up-sampling, the signal is transmitted to filter $g_2(n)$ 72 to derive the code word to be transmitted to the receiver 30. The $g_2(n)$ filter 72 of FIG. 4 is representative of the combination of the filters $\lambda_0$, $g_0$, $\lambda_1$ and $g_1$ of FIG. 3. In demonstrating the relationship between filter $g_2(n)$ of FIG. 4 and the filters $\lambda_0$, $g_0$, $\lambda_1$ and $g_1$ of FIG. 3, the z-transform of $g_2(n)$ can be represented as follows: $G_2(z)=\lambda_0(z^2)G_0(z)+\lambda_1(z^2)G_1(z) \mod(Z^{-N}-1)$. After fixing the values for filters $\lambda_0$, $g_0$, $\lambda_1$ and $g_1$ as shall be demonstrated herein, the value of filter $g_2(n)$ may be derived utilizing the equation, $$G_2(z) = \sum_{i=0}^{L-1} g_2(n)z^{-n}$$

where L is the number of filter coefficients, or the length the filter.

Figure 5:
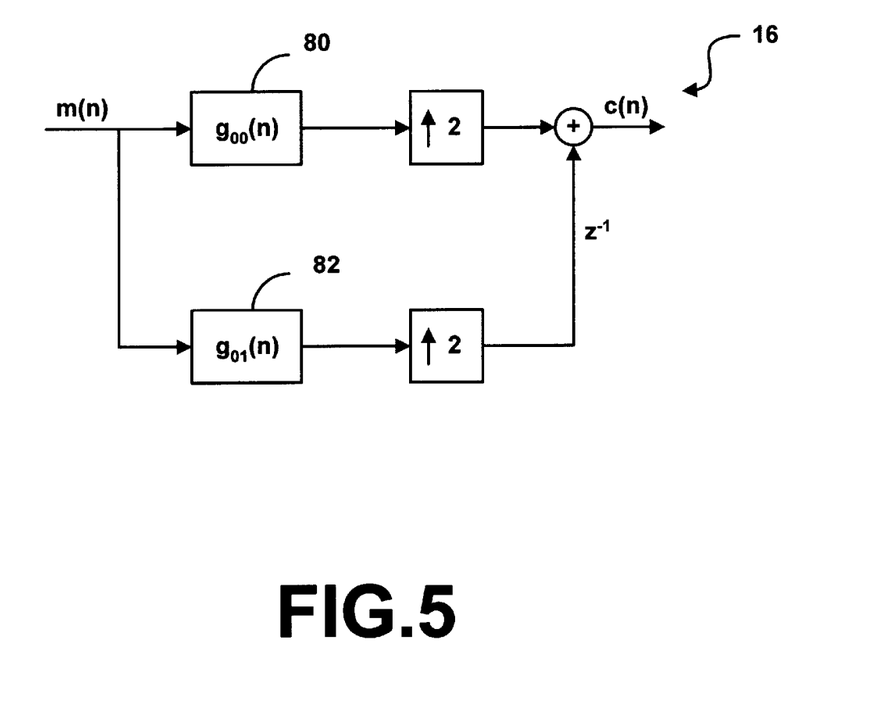
FIG. 5 shows the channel encoder of FIG. 1 implemented by polyphase structure.

It is important to note that the channel encoder 16 of FIG. 3, 4 may also be implemented by polyphase structure, as is demonstrated by FIG. 5. In so doing, as in FIG. 4, we allow G(z) to be a filter with the z-transform obtained as $G_2(z)=\lambda_0(z^2)G_0(z)+\lambda_1(z^2)G_1(z) \mod(Z^{-N}-1)$. Then, as shown by filters 80 and 82 respectively, $g_{00}(n)$ and $g_{01}(n)$ are considered to be the polyphase components of G(Z), and $G_2(z)$ may be solved similar to the method used in FIG. 4.

Filter Coefficient Derivation

While the process of encoding, performed by the channel encoder 16, is described above in FIGS. 2–5 with respect to a transmitted message block, in order to perform pre-filtering and an inverse wavelet transform the following must be performed to derive the filter coefficients $g_0(n)$, $g_1(n)$, $\lambda_0(n)$ and $\lambda_1(n)$.

For purposes of better understanding, the computations and relationships for deriving the abovementioned filters will be explained in accordance with FIG. 3. In deriving the aforementioned filter coefficients, the relational equation $x(n)=\Sigma<\theta_k(n), x(n)>\theta_k(n)$ is utilized, wherein $\theta_k(n)$ represents the basis function, and the inner product of $<\theta_k(n), x(n)>$ is used to derive the wavelet coefficients of the basis function. The inverse wavelet representation of this relational equation, with relation to FIG. 3, namely $$c(n) = \sum_{j \in z} \langle g_0(n-2j), c(n)\rangle g_0(n-2j) + \sum_{j \in z} \langle g_1(n-2j), c(n)\rangle g_1(n-2j)$$

is then taken, wherein the two functions $g_0(n)$ and $g_1(n)$ relate to the scaling function and mother wavelet respectively. In this equation, the inner product of $<g_0(n-2j), c(n)>$ is representative of the wavelet coefficient $x_0(n)$ of FIG. 3 and the inner product of $<g_1(n-2j), c(n)>$ is representative of the wavelet coefficient $x_1(n)$ of FIG. 3. Therefore, c(n) can be represented by the equation:

$$c(n) = \sum_{j \in z} x_0(j)g_0(n-2j) + \sum_{j \in z} x_1(j)g_1(n-2j).$$

To solve for $g_0(n)$ and $g_1(n)$ the equation $A(z)A^c(z)+B(z)B^c(z)=z^M$ is solved, wherein the solutions A(z) and B(z) are related to the values of the filter coefficients. As will be discussed herein, the filter coefficients relating to the channel decoder 24 of FIG. 1 are $h_0(n)$ and $h_1(n)$, with the z transforms of these coefficients being $H_0(z)$ and $H_1(z)$ respectively. Since each of the filter coefficients of the channel encoder and the channel decoder are related they are designated by the equations:

$H_1(z)=H_0(-z^{-1})$ $G_0(z)=H_0(z^{-1})$ $G_1(z)=H_1(z^{-1})$

Therefore, if a solution is calculated for $H_0(z)$, all other coefficient can be derived.

To solve for $H_0(z)$, $H_0(z)$ is written as a polyphase representation.

$H_0(z)=E_{00}(z^2)+z^{-1}E_{01}(z^2)$

In this equation $E_{00}(z)$ and $E_{01}(z)$ are considered the polyphase components of $H_0(z)$. Thus, a solution to $E_{00}(z)$ and $E_{01}(z)$ must be found. To solve for $E_{00}(z)$ and $E_{01}(z)$ the following two equations are used.

$$E_{00}(z) = \sum_{i=0}^{M} e_{0i}z^{-i}, \ e_{00} \neq 0, \ e_{0i} \in GF(p^r)$$

$$E_{01}(z) = \sum_{i=0}^{N} e_{1i}z^{-i}, \ e_{1N} \neq 0, \ e_{1i} \in GF(p^r)$$

In these two equations, 2N+2 is the length of the filter, and M is an arbitrary parameter less than or equal to N. Therefore, derivation of $e_{0i}$ and $e_{1i}$ will render solutions to $E_{00}(z)$ and $E_{01}(z)$. From the above equations for $E_{00}(z)$ and $E_{01}(z)$ it is concluded that:

$e_{0i}=0$ i=(M+1), . . . , N $e_{1i}=0$ i=0, . . . , N−M−1

There is also a relationship between the coefficients of the two polynomials A(z) and B(z), and the polyphase components $E_{00}(z)$ and $E_{01}(z)$ depicted as:

$a_i=e_{0i}$, $b_i=e_{1(N-M+i)}$ for i=0, . . . , M.

To solve for the abovementioned equations a finite field with a particular characteristic must be chosen. Particularly, for better understanding and as an example, a solution is derived for a finite field with characteristic 2. Fields with characteristic 2 have the property such that 2k=0 for any k in GF(2'). This property enables the derivation of symmetric solutions of $A(z)A^C(z)+B(z)B^C(z)=z^M$.

In the field GF(2'), $A(z)A^C(z)+B(z)B^C(z)=z^M$ can be rewritten as $A(z)A^c(z)+z^M=B(z)B^c(z)$, where superscript "c"

is the reciprocal of the polynomial. Next, we look for the pair of polynomials of the form:

$$A(z) = \sum_{i=0}^{M} a_i z^i, a_0 \neq 0, M \leq N$$

$$B(z) = \sum_{i=0}^{M} b_i z^i, b_M \neq 0, M \leq N$$

In fields with characteristic 2, M is an arbitrarily chosen even number less than or equal to N. Then above equation can be written as:

$$\{A(z)+z^{M/2}\}\{A(z)+z^{M/2}\}=B(z)B^C(z)$$

provided that $A(z)$ is a symmetric polynomial, $A(z)=A^c(z)$. Therefore, in this example, any $B(z)$ equal to $A(z)+z^{M/2}$ is also a symmetric polynomial.

In summary, if M is an even number, the polynomial pair $A(z)$ and $A(z)+z^{M/2}$ is a solution to $A(z)A^C(z)+B(z)B_C(z)=z^M$ over GF(2'), where $A(z)$ is any arbitrary symmetric polynomial of degree M with a nonzero constant coefficient. The following table gives all the possible distinct orthogonal perfect reconstruction filter banks up to order eleven over GF(2). The first column of this table lists the values of M for which a solution for $A(z)A^C(z)+B(z)B_C(z)=z^M$ can be obtained. The second, third and fourth columns show the filter order, the coefficients of $H_0(z)$ and $H_1(z)$, respectively. It should be noted that the filter coefficients are represented in Hexadecimal (by padding sufficient zeroes to the left) form with the LSB bit as the coefficient of the highest degree. The nonsymmetric solutions are also included in Table 1 below.

As an example, one of the nonsymmetrical solutions over GF(8) is derived in the following. The task herein is to determine all of the orthogonal filter banks of the lowest nontrivial order, 3, over GF(2'). $H_0(z)$ is considered as a monic polynomial, and consequently $B(z)$ is a monic polynomial of degree one. The general solution for $z^M$ is:

$$A(z) = a(1+a)^{-1} + az \quad a \neq 1, a \in GF(2')$$

$$B(z) = a^2(1+a)^{-1} + z \quad a \neq 1, a \in GF(2')$$

Using this solution, the orthogonal filter bank of order 3 over $GF(2^3)$ can be constructed. In order to construct the extension field $GF(2^3)$, the primitive polynomial $q(y)=1+y+y^3$ is chosen as an irreducible polynomial over GF(2). Then, by arbitrarily choosing a=2 (the polynomial representation of this number in the extension field is a=y), the filters are specified as:

$$H_0(z)=7+5z^{-1}+2z^{-2}+z^{-3}$$

$$H_1(z)=1+2z^{-1}+5z^{-2}+7z^{-3}$$

TABLE 1

| M | Order | $H_0(z)$ | $H_1(z)$ |
|---|---|---|---|
| 2 | 5 | 37 | 3B |
| 2 | 7 | 9D | B9 |
| 2 | 9 | 235 | 2B1 |
| 4 | 9 | 3EF | 3DF |
| 4 | 9 | 323 | 313 |
| 2 | 11 | 895 | A91 |
| 4 | 11 | 989 | 919 |

TABLE 1-continued

| M | Order | $H_0(z)$ | $H_1(z)$ |
|---|---|---|---|
| 4 | 11 | BED | B7D |
| 5 | 11 | DE7 | E7B |
| 5 | 11 | DB7 | EDB |

Finally, since $H_0$ has been solved according to the above-mentioned equations, coefficients $g_0(n)$, $g_1(n)$ and $\lambda_0(n)$ and $\lambda_1(n)$ may be solved.

Figure 6:
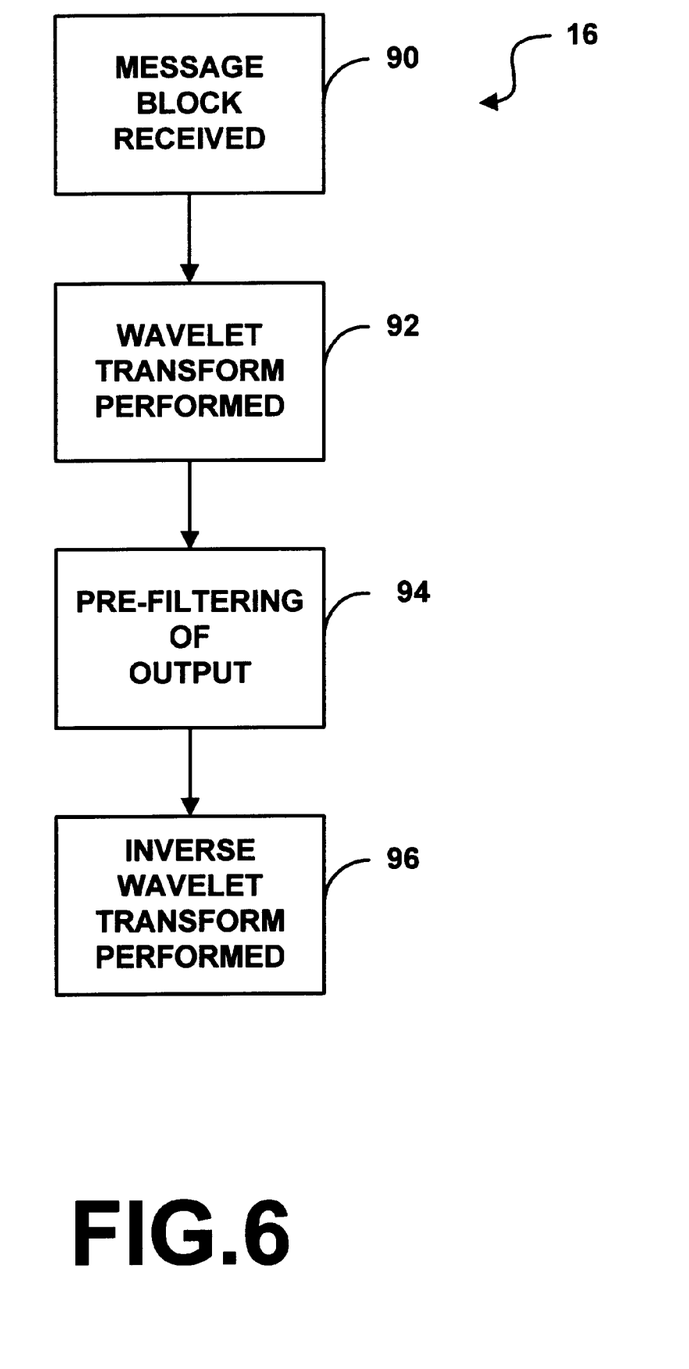
FIG. 6 is a functional representation of the channel encoder of FIG. 1 for arbitrary rate (N,K) codes.
Figure 7:
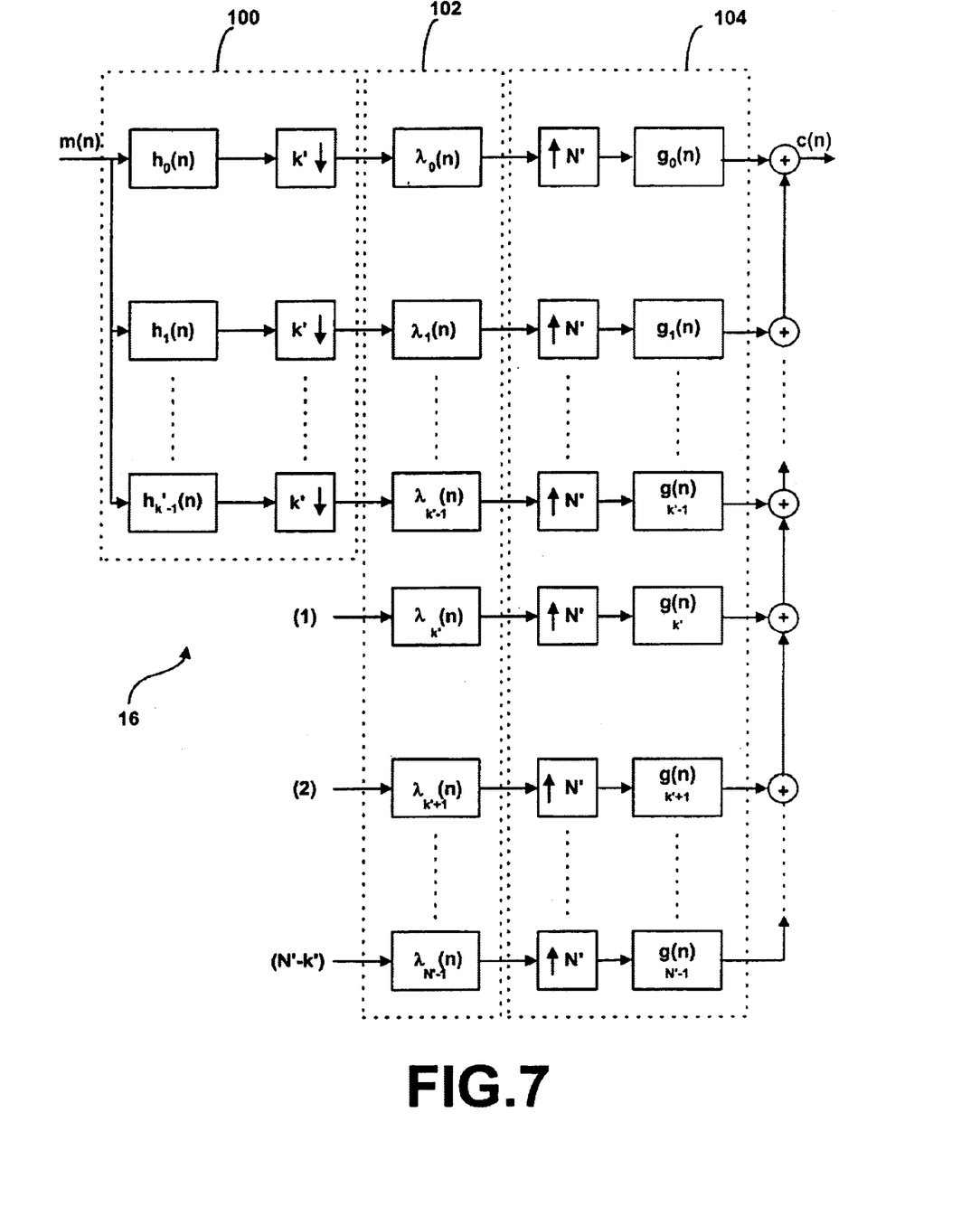
FIG. 7 shows a block diagram of the channel encoder of FIG. 6 utilizing arbitrary rate (N,K) codes.

In accordance with a second embodiment of the invention, as depicted by FIG. 6 and FIG. 7, FIG. 6 is a functional diagram of the channel encoder 16 for arbitrary rate (N,K) codes, wherein N relates to the code word length and K relates to message block length. Accordingly, a message block is first received by the channel encoder 16 from the encryption device 14 (step 90). A wavelet transform is then performed on the message block (step 92). The output from the wavelet transform is then pre-filtered to give wavelet coefficients (step 94). An inverse wavelet transform is then performed on the wavelet coefficients to derive the code words to be transmitted to the receiver (step 96).

FIG. 7 is a general block diagram of the channel encoder 16 representing arbitrary rate (N, K) codes, wherein N relates to the code word length and K relates to message block length. Preliminarily, k' is equal to K/gcd(N,K) where gcd is the greatest common divisor, and N' is equal to N/gcd(N,K). First, the message block is passed through a k'-band filter bank (operating a wavelet transform) to generate data streams 100. Then the data streams are prefiltered to obtain wavelet coefficients 102. An inverse wavelet transform is then performed 104 to generate the code word.

Channel Decoder

Figure 8:
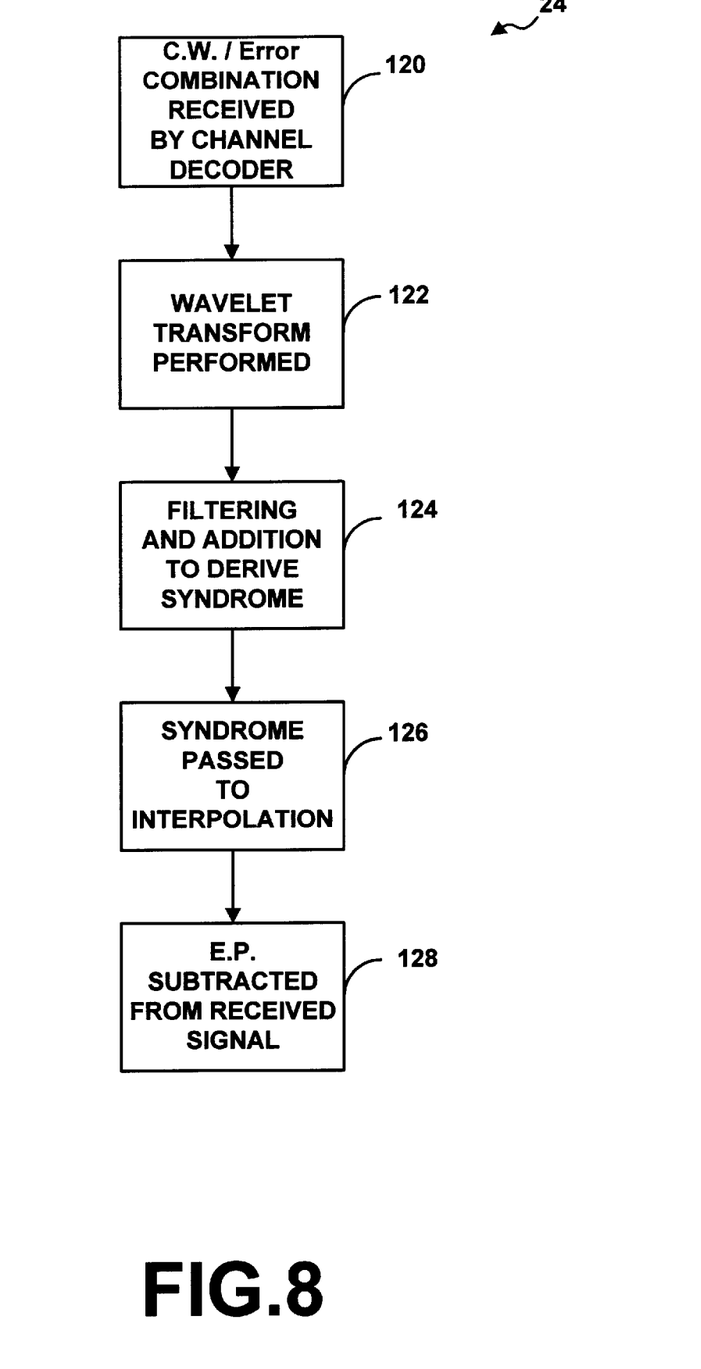
FIG. 8 is a functional representation of the channel decoder of FIG. 1 after receiving a code word/channel error combination.

In accordance with the first embodiment of the invention FIG. 8 is a functional representation of the channel decoder 24. As discussed in the aforementioned disclosure, when the code word is received by the channel decoder, code errors are incorporated therein. This code word, error combination, is first received by the channel decoder 24 from the demodulator 22 (step 120). A wavelet transform is then performed on the code word, error combination (step 122). The output from the wavelet transform is then filtered and added together to derive what is referred to as a syndrome output (step 124), wherein the syndrome is symptomatic of the error received from the physical channel or storage medium 20, and does not contain a portion of the code word therein. The syndrome is then passed to interpolation to generate the error pattern (step 126). Finally, the error pattern is subtracted from the received signal to correct errors (step 128), thereby deriving the original message.

Figure 9:
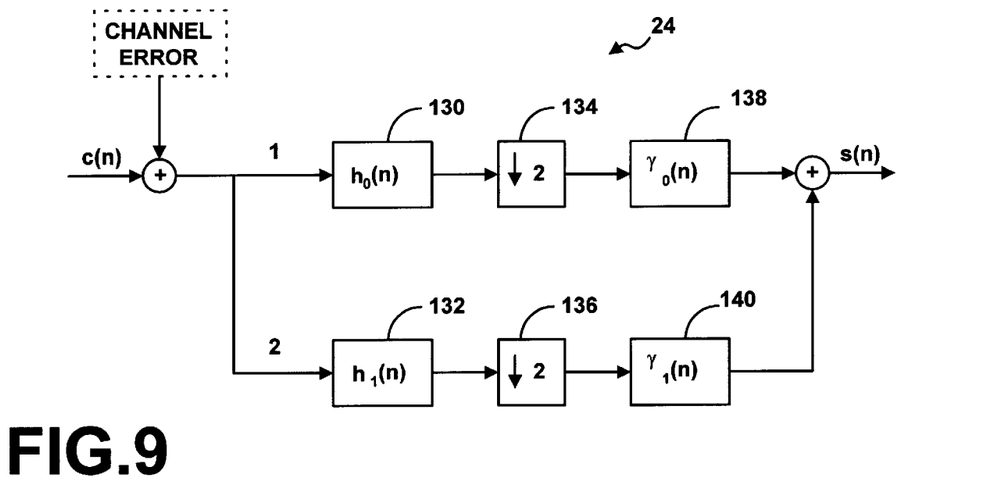
FIG. 9 shows a block diagram of the filter bank structure forming the channel decoder of FIG. 1, utilizing half-rate code.

As shown in FIG. 9, the channel decoder 24 comprises a filter bank structure which utilizes half-rate codes. First, the code word/error combination is transmitted to two parallel branches of the decoder structure, namely branch 1 and branch 2. A wavelet transform is then performed on both the first and second branches of the channel decoder, wherein the code word/error combination is first filtered through filters $h_0(n)$ 130 and $h_1(n)$ 132, the coefficients of which have been solved for above with reference to filters $g_0(n)$ and $g_1(n)$. The filtered combination is then down-sampled by a factor of 2 by operation blocks 134 and 136, corresponding to the first and second branches. After down-sampling, the message is filtered by filter $\gamma_0(n)$ 138 on the first branch and $\gamma_1(n)$ 140 on the second branch. Finally, after filtering, the two branches are added together, deriving the syndrome.

Figure 10:
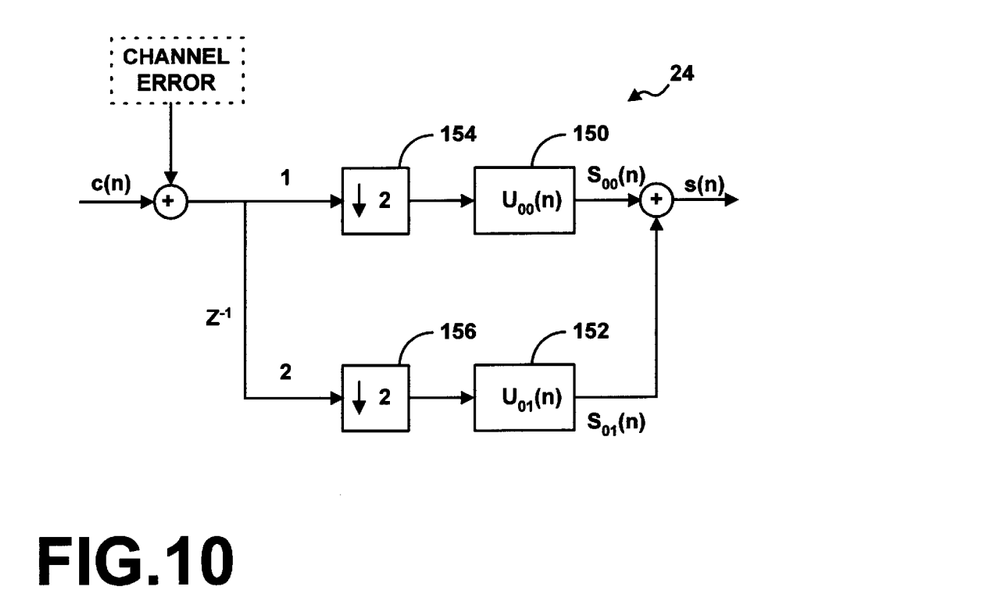
FIG. 10 shows the channel decoder of FIG. 1 implemented by polyphase structure to derive a syndrome.

The derivation of the syndrome may best be described when considering the channel decoder 24 implemented by polyphase structure, as is shown in FIG. 10. In so doing, H(z) is a filter with the z-transform obtained as $H_2(z)=\Gamma_0(z^2)H_0(z)+\Gamma_1(z^2)H_1(z) \mod(Z^{-N}-1)$. Then, as shown by filters 150 and 152 respectively, $u_{00}(n)$ and $u_{01}(n)$ are considered to be the polyphase components of H(Z), and $H_2(z)$ may be solved. As is shown by FIG. 10, the code word/error combination is transmitted to two branches, namely branch one and branch two, in which the combination is first down-sampled by a factor of 2 (representative of half-code) by filters 154 and 156 respectively. The first and second branches are then filtered by filters 150 and 152 rendering a first syndrome output, $s_{00}(n)$, and a second syndrome output, $s_{01}(n)$. Finally, the addition of these outputs renders the total syndrome output, s(n).

Figure 11:
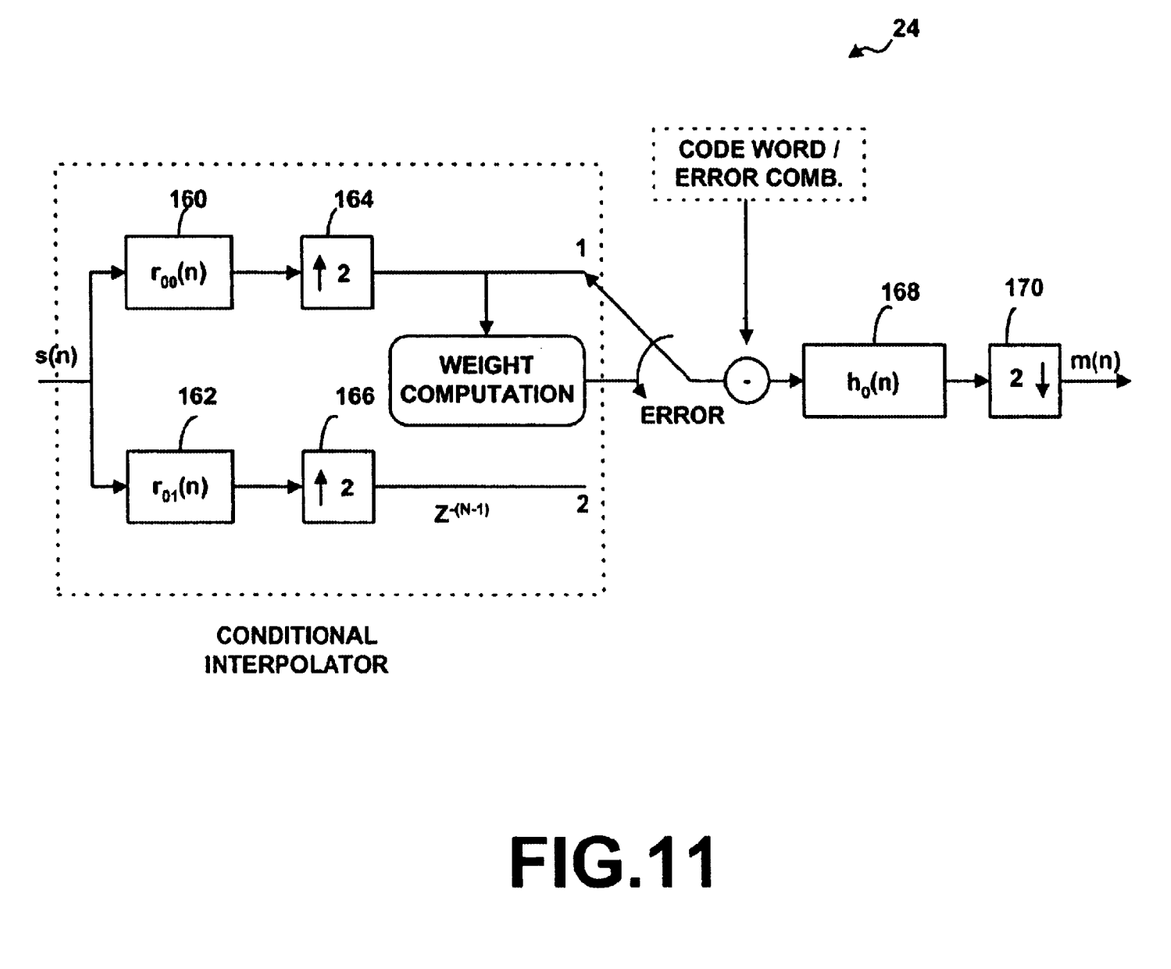
FIG. 11 shows a block diagram of the filter bank structure utilized by the channel decoder to analyze the syndrome of FIG. 10.

After deriving s(n), the channel decoder 24 of FIG. 11 is then utilized to reconstruct the original message sequence. In accordance with FIG. 11, the total syndrome is sent in parallel to an even branch and an odd branch, respectively branch 1 and branch 2. The syndrome is then filtered by filter $r_{00}(n)$ 160 on the even branch, and by filter $r_{01}(n)$ 162 on the odd branch, wherein the filters $r_{00}(n)$ and $r_{01}(n)$ are the inverse filters of $u_{00}(n)$ and $u_{01}(n)$ of FIG. 10. A weight computation is then performed by a conditional interpolator to determine whether the even or odd branch contains the error. If the error occurs on the even branch, the first branch is utilized in the computation of the error output. Therefore, the syndrome output would be a function of the multi-rate filters associated with the even branch. Likewise, if the error occurs on the second branch, the bottom branch is utilized and derives the error.

After filtering, the syndrome is up-sampled by a factor of 2 by operation blocks 164 and 166. With rendition of the error, the derived error is subtracted from the received code word, thereby computing the original code word. Finally, a synthesis of a frame operator is performed on the code word to formulate the originally sent message. As is shown in FIG. 11 the synthesis of a frame operator consists of filtering the code word, by filter 168, and down-sampling by a factor of 2, by filter 170.

It should be noted that the decoders which are utilized in this invention may also be utilized to decode third party user code. The only requirement for this function is that the third party code have the same structure as a wavelet code. As an example, certain codes, such as Golay codes and certain Reed Solomon codes, have a wavelet interpretation. Thus, even though the third party code is not necessarily encoded using a wavelet, its wavelet structure allows it to be decoded using the aforementioned wavelet decoder.

In concluding the detailed description of the present invention, it should be noted that it will be obvious to those skilled in the art that many variations and modifications may be made to the embodiments discussed herein without substantially departing from the principles of the present invention. All such variations and modifications are intended to be included herein within the scope of the present invention, as set forth in the following claims. Further, in the claims hereinafter, the corresponding structures, materials, acts, and equivalents of all means or step plus function elements are intended to include any structure, material, or acts for performing the functions in combination with either claimed elements as specifically claimed.

The following is claimed:

1. An encoder for enabling efficient error correction, comprising a means for receiving message data comprising a plurality of message data streams and for performing a mathematical inverse wavelet transformation over a finite field on said plurality of message data streams to produce a single stream of transmission data.

2. The encoder of claim 1, wherein said mathematical inverse wavelet transformation is further defined by a frame operation.

3. The encoder of claim 1, wherein said transmission data is selected from the group consisting of multidimensional code data, block code data, convolutional code data, or nonlinear code data.

4. The encoder of claim 1, wherein said means is a multi-rate filter.

5. The encoder of claim 1, further comprising a means for combining a plurality of wavelet basis vectors based upon said message data and said mathematical inverse wavelet transformation to produce said transmission data as a code word.

6. The encoder of claim 1, wherein said means is a digital filter, said digital filter configured to exhibit a predefined transfer function defined by a set of predefined filter coefficients, said filter coefficients being defined to perform said mathematical inverse wavelet transformation on said message data.

7. The encoder of claim 1, wherein said means is an analog filter, said analog filter configured to exhibit a predefined transfer function defined by a set of predefined filter parameters, said predefined filter parameters defining said mathematical inverse wavelet transformation.

8. The encoder of claim 1, wherein said plurality of message data streams have a predefined relationship.

9. The encoder of claim 1, wherein said plurality of said message data streams are identical.

10. The encoder of claim 1, further comprising:
means for combining wavelet basis vectors based upon said plurality of message data streams and said inverse mathematical wavelet transformation in order to produce said single data stream as a series of code words.

11. The encoder of claim 1, further comprising a means for performing a mathematical wavelet transformation over said finite field on said message data, in addition to said mathematical inverse wavelet transformation, in order to produce said transmission data.

12. The encoder of claim 1, further comprising a means for communicating said transmission data over a wired electrical connection.

13. The encoder of claim 1, further comprising a means for communicating said transmission data over a wireless communications medium.

14. The encoder of claim 1, further comprising a means for communicating said transmission data to a memory from the group consisting of electrical, magnetic, optical, holographic, page oriented storage.

15. A method for encoding data, comprising the steps of:
receiving message data comprising a plurality of message data streams; and
performing a mathematical inverse wavelet transformation over a finite field on said plurality of message data streams to produce a single stream of transmission data.

16. The method of claim 15, wherein said mathematical inverse wavelet transformation analysis is further defined by a frame operation.

17. The method of claim 15, wherein said transmission data is selected from the group consisting of multidimensional code data, block code data, convolutional code data, or nonlinear code data.

18. The method of claim 15, further comprising the step of:
combining a plurality of wavelet basis vectors based upon said message data and said mathematical inverse wavelet transformation in order to produce said transmission data as a code word.

19. The method of claim 15, further comprising the steps of:
receiving said message data at a digital filter; and
implementing said performing step by causing said digital filter to exhibit a predefined transfer function defined by a set of predefined filter coefficients.

20. The method of claim 15, further comprising the steps of:
receiving said message data at an analog filter; and
implementing said performing step by causing said analog filter to exhibit a predefined transfer function defined by a set of predefined filter parameters, said predefined filter parameters defining said mathematical inverse wavelet transformation.

21. The method of claim 15, wherein said plurality of message data streams have a predefined relationship.

22. The method of claim 15, further comprising the step of:
combining wavelet basis vectors based upon said plurality of message data streams and said mathematical inverse wavelet transformation in order to produce said single data stream as a series of code words.

23. The encoder of claim 15, wherein said step of performing said mathematical inverse wavelet transformation is performed by at least one multi-rate filter.

24. The method of claim 15, wherein said plurality of message data streams are the same.

25. The method of claim 15, further comprising the step of:
performing a mathematical wavelet transformation over said finite field on said message data, in addition to said mathematical inverse wavelet transformation, in order to produce said transmission data.

26. The method of claim 15, further comprising the step of communicating said transmission data over a wired electrical connection.

27. The method of claim 15, further comprising the step of communicating said transmission data over a wireless communications medium.

28. The method of claim 15, further comprising the step of communicating said transmission data to a memory from the group consisting of electrical, magnetic, optical, holographic, or page oriented storage.

29. A decoder, comprising a means for receiving transmission data and for performing a mathematical wavelet transformation over a finite field on said transmission data to produce a plurality of message data streams, said plurality of message data streams having a predefined relationship and used to produce syndrome data.

30. The decoder of claim 29, wherein said mathematical wavelet transformation is further defined by a frame operation.

31. The decoder of claim 30, further comprising an error correction means associated with said transmission data to achieve a more accurate version of said message data.

32. The decoder of claim 31, wherein said error correction means employs polyphase inverse filtering, an error locator technique, or a combination thereof.

33. The decoder of claim 32, wherein after said error correction is implemented by said error correction means, a synthesis of a frame operator is applied to corrected transmission data to obtain said message data.

34. The decoder of claim 33, further comprising a multi-rate filter for producing said frame operator.

35. The decoder of claim 29, wherein said transmission data is selected from the group consisting of multidimensional code data, block code data, convolutional code data, or nonlinear code data.

36. The decoder of claim 29, wherein said means is a multi-rate filter.

37. The decoder of claim 29, wherein a wavelet transformation is performed upon said transmission data to produce a plurality of data streams and then an inverse wavelet transformation is performed upon said plurality to produce a single data stream.

38. The decoder of claim 37, wherein error correction is performed upon said plurality of data streams or said single data stream or a combination thereof.

39. The decoder of claim 29, further defined by performing a mathematical inverse wavelet transformation in addition to performing said mathematical wavelet transformation.

40. The decoder of claim 29, further comprising a means for deriving a plurality of wavelet coefficients based upon said transmission data and said mathematical wavelet transformation in order to produce said message data.

41. The decoder of claim 29, wherein said means is a digital filter, said digital filter configured to exhibit a predefined transfer function defined by a set of predefined filter coefficients, said filter coefficients being defined to perform said mathematical wavelet transformation on said transmission data.

42. The decoder of claim 29, wherein said means is an analog filter, said analog filter configured to exhibit a predefined transfer function defined by a set of predefined filter parameters, said predefined filter parameters defining said mathematical wavelet transformation.

43. The decoder of claim 29, wherein said plurality of message data streams are identical.

44. The decoder of claim 29, further comprising:
means for producing wavelet coefficients based upon said transmission data stream and said mathematical wavelet transformation in order to produce said plurality of data streams.

45. The decoder of claim 29, further comprising a means for producing a single message data stream from said plurality of message data streams and for correcting errors imposed upon said message data stream by a communications channel while said message data stream was encoded as said transmission data, based upon said plurality of message data streams.

46. The decoder of claim 29, further comprising a means for performing a mathematical inverse wavelet transformation over said finite field on said transmission data, in addition to said mathematical wavelet transformation, in order to produce said message data.

47. The decoder of claim 29, further comprising a means for receiving said transmission data from a wired electrical connection.

48. The decoder of claim 29, further comprising a means for receiving said transmission data from a wireless communications medium.

49. The decoder of claim 29, further comprising a means for receiving said transmission data from a memory from the group consisting of electrical, magnetic, optical, holographic, page oriented storage.

50. A method for decoding messages, comprising the steps of:
receiving transmission data; and
performing a mathematical wavelet transformation over a finite field on said transmission data to produce message data having a plurality of message data streams, said plurality of message data streams having a predefined relationship.

51. The method of claim 50, wherein said mathematical wavelet transformation is further defined by a frame operation.

52. The method of claim 51, further comprising the step of performing an error correction operation to correct errors associated with said transmission data to achieve a more accurate version of said message data.

53. The method of claim 52, wherein said step of error correction employs polyphase inverse filtering, an error locator technique, or a combination thereof.

54. The method of claim 53, wherein after said step of error correction, a synthesis of said frame operator is applied to corrected transmission data to obtain said message data.

55. The method of claim 54, further comprising the step of producing said frame operator with a multi-rate filter.

56. The method of claim 51, further comprising the step of:

performing a mathematical inverse wavelet transformation over said finite field on said transmission data, in addition to said mathematical wavelet transformation, in order to produce said message data.

57. The method of claim 50, wherein said transmission data is selected from the group consisting of multidimensional code data, block code data, convolutional code data, or nonlinear code data.

58. The method of claim 50, further comprising the step of:

deriving a plurality of wavelet coefficients based upon said transmission data and said mathematical wavelet transformation in order to produce said message data as a code word.

59. The method of claim 50, further comprising the step of:

communicating said transmission data to a digital filter, said digital filter configured to exhibit a predefined transfer function defined by a set of predefined filter coefficients, said filter coefficients being defined to perform said mathematical wavelet transformation on said transmission data.

60. The method of claim 50, further comprising the step of:

communicating said transmission data to an analog filter, said analog filter configured to exhibit a predefined transfer function defined by a set of predefined filter parameters, said predefined filter parameters defining said mathematical wavelet transformation.

61. The method of claim 50, wherein said plurality of message data streams are identical.

62. The method of claim 50, further comprising:

means for producing wavelet coefficients based upon said transmission data and said mathematical wavelet transformation in order to produce said plurality of message data streams.

63. The method of claim 50, further comprising the steps of:

producing a single message data stream from said plurality of message data streams; and correcting errors imposed upon said single message data stream by a communications channel while said single message data stream was encoded as said transmission data, based upon said plurality of message data streams.

64. The method of claim 50, further comprising a means for receiving said transmission data from a wired electrical connection.

65. The method of claim 50, further comprising a means for receiving said transmission data from a wireless communications medium.

66. The decoder of claim 50, further comprising a means for communicating said transmission data from a memory from the group consisting of electrical, magnetic, optical, holographic, page oriented storage.

67. A system for designing coders, comprising:

means for receiving a number base and wavelet length;

means for producing wavelet basis vectors based upon said number base, said wavelet length, and a mathematical operation, wherein said mathematical operation is chosen from the group consisting of a wavelet transformation, inverse wavelet transformation, or a combination thereof.

68. The system of claim 67, wherein said mathematical operation is further defined by a frame operation.

69. The system of claim 67, further comprising:

means for producing coefficients for a digital filter for an encoder based upon said wavelet basis vectors, said coefficients for causing said digital filter to transform message data into transmission data.

70. The system of claim 67, further comprising:

means for producing coefficients for a digital filter for a decoder based upon said wavelet basis vectors, said coefficients for causing said digital filter to transform transmission data into message data.

71. The system of claim 67, further comprising:

means for producing parameters for an analog filter for an encoder based upon said wavelet basis vectors, said coefficients for causing said analog filter to transform a message signal into a transmission signal.

72. The system of claim 67, further comprising:

means for producing parameters for an analog filter for a decoder based upon said wavelet basis vectors, said coefficients for causing said analog filter to transform a transmission signal into a message signal.

73. The system of claim 67, wherein said wavelet basis vectors define one data stream based upon a plurality of data streams.

74. The system of claim 67, wherein said wavelet basis vectors define a plurality of data streams based upon one data stream.

75. The system of claim 67 implemented in software, hardware, firmware, or a combination thereof.

76. A method for designing coders, comprising the steps of:

selecting a number base and wavelet length;

producing wavelet basis vectors based upon said number base, said wavelet length, and a mathematical operation, wherein said mathematical operation is chosen from the group consisting of a wavelet transformation, inverse wavelet transformation, or a combination thereof.

77. The method of claim 76, wherein said mathematical operation is further defined by a frame operation.

78. The method of claim 76, wherein said means for performing said mathematical operation is at least one multi-rate filter.

79. The method of claim 76, further comprising the step of:

producing coefficients for a digital filter for an encoder based upon said wavelet basis vectors, said coefficients for causing said digital filter to transform message data into transmission data.

80. The method of claim 76, further comprising the step of:

producing coefficients for a digital filter for a decoder based upon said wavelet basis vectors, said coefficients for causing said digital filter to transform transmission data into message data.

81. The method of claim 76, further comprising the step of:
producing parameters for an analog filter for an encoder based upon said wavelet basis vectors, said coefficients for causing said analog filter to transform a message signal into a transmission signal.

82. The method of claim 76, further comprising the step of:
producing parameters for an analog filter for a decoder based upon said wavelet basis vectors, said coefficients for causing said analog filter to transform a transmission signal into a message signal.

83. The method of claim 76, wherein said wavelet basis vectors define one data stream based upon two data streams.

84. The method of claim 76, wherein said wavelet basis vectors define two data streams based upon one data stream.

85. An encoder for enabling efficient error correction, comprising a means for receiving message data and for performing a mathematical inverse wavelet transformation over a finite field on said message data to produce transmission data; and
means for combining a plurality of wavelet basis vectors based upon said message data and said mathematical inverse wavelet transformation to produce said transmission data as a code word.

86. An encoder for enabling efficient error correction, comprising:
means for receiving message data and for performing a mathematical inverse wavelet transformation over a finite field on said message data to produce transmission data;
wherein said means is a digital filter, said digital filter configured to exhibit a predefined transfer function defined by a set of predefined filter coefficients, said filter coefficients being defined to perform said mathematical inverse wavelet transformation on said message data.

87. An encoder for enabling efficient error correction, comprising:
means for receiving message data and for performing a mathematical inverse wavelet transformation over a finite field on said message data to produce transmission data;
wherein said means is an analog filter, said analog filter configured to exhibit a predefined transfer function defined by a set of predefined filter parameters, said predefined filter parameters defining said mathematical inverse wavelet transformation.

88. An encoder for enabling efficient error correction, comprising:
means for receiving message data and for performing a mathematical inverse wavelet transformation over a finite field on said message data to produce transmission data; and
means for performing a mathematical wavelet transformation over said finite field on said message data, in addition to said mathematical inverse wavelet transformation, in order to produce said transmission data.

89. A method for encoding data, comprising the steps of:
receiving message data;
performing a mathematical inverse wavelet transformation over a finite field on said message data to produce transmission data; and
combining a plurality of wavelet basis vectors based upon said message data and said mathematical inverse wavelet transformation in order to produce said transmission data as a code word.

90. A method for encoding data, comprising the steps of:
receiving message data at a digital filter; and
performing a mathematical inverse wavelet transformation over a finite field on said message data to produce transmission data by causing said digital filter to exhibit a predefined transfer function defined by a set of predefined filter coefficients.

91. A method for encoding data, comprising the steps of:
receiving message data at an analog filter; and
performing a mathematical inverse wavelet transformation over a finite field on said message data to produce transmission data by causing said analog filter to exhibit a predefined transfer function defined by a set of predefined filter parameters, said predefined filter parameters defining said mathematical inverse wavelet transformation.

92. A decoder, comprising:
means for receiving transmission data and for performing a mathematical wavelet transformation over a finite field on said transmission data to produce syndrome data; and
an error correction means associated with said transmission data to achieve a more accurate version of said message data;
wherein said mathematical wavelet transformation is further defined by a frame operation and said error correction means employs polyphase inverse filtering, an error locator technique, or a combination thereof.

93. A decoder comprising a means for receiving transmission data and for performing a mathematical wavelet transformation over a finite field on said transmission data to produce syndrome data;
wherein a wavelet transformation is performed upon said transmission data to produce a plurality of data streams and then an inverse wavelet transformation is performed upon said plurality to produce a single data stream.

94. A decoder comprising a means for receiving transmission data and for performing a mathematical wavelet transformation over a finite field on said transmission data to produce syndrome data;
wherein said means is a digital filter, said digital filter configured to exhibit a predefined transfer function defined by a set of predefined filter coefficients, said filter coefficients being defined to perform said mathematical wavelet transformation on said transmission data.

95. A decoder comprising a means for receiving transmission data and for performing a mathematical wavelet transformation over a finite field on said transmission data to produce syndrome data;
wherein said means is an analog filter, said analog filter configured to exhibit a predefined transfer function defined by a set of predefined filter parameters, said predefined filter parameters defining said mathematical wavelet transformation.

96. A decoder comprising:
means for receiving transmission data and for performing a mathematical wavelet transformation over a finite field on said transmission data to produce syndrome data; and means for performing a mathematical inverse wavelet transformation over said finite field on said transmission data, in addition to said mathematical wavelet transformation, in order to produce said message data.

97. A method for decoding messages, comprising the steps of:

receiving transmission data;

performing a mathematical wavelet transformation over a finite field on said transmission data to produce message data; and communicating said transmission data to a digital filter, said digital filter configured to exhibit a predefined transfer function defined by a set of predefined filter coefficients, said filter coefficients being defined to perform said mathematical wavelet transformation on said transmission data.

98. A method for decoding messages, comprising the steps of:

receiving transmission data;

performing a mathematical wavelet transformation over a finite field on said transmission data to produce message data; and communicating said transmission data to an analog filter, said analog filter configured to exhibit a predefined transfer function defined by a set of predefined filter parameters, said predefined filter parameters defining said mathematical wavelet transformation.

99. A method for decoding messages, comprising the steps of:

receiving transmission data;

performing a mathematical wavelet transformation over a finite field on said transmission data to produce message data, wherein said mathematical wavelet transformation is further defined by a frame operation; and performing a mathematical inverse wavelet transformation over said finite field on said transmission data, in addition to said mathematical wavelet transformation, in order to produce said message data.

100. A method for decoding messages, comprising the steps of:

receiving transmission data; and performing a mathematical wavelet transformation over a finite field on said transmission data to produce message data wherein said mathematical wavelet transformation is further defined by a frame operation; and performing an error correction operation to correct errors associated with said transmission data to achieve a more accurate version of said message data, wherein said step of error correction employs polyphase inverse filtering, an error locator technique, or a combination thereof.

* * * * *